US011829179B2

(12) United States Patent
Hermann (10) Patent No.: US 11,829,179 B2
(45) Date of Patent: Nov. 28, 2023

(54) INTEGRATED CIRCUIT AND METHOD FOR LIMITING A SWITCHABLE LOAD CURRENT (71) Applicant: Robert Bosch GmbH, Stuttgart (DE)

(72) Inventor: Carsten Hermann, Dusslingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/838,998

(22) Filed: Jun. 13, 2022

(65) Prior Publication Data
US 2022/0397928 A1 Dec. 15, 2022

(30) Foreign Application Priority Data

Jun. 15, 2021 (DE) ...................... 10 2021 206 080.3

(51) Int. Cl.
| G05F 3/26 | (2006.01) |
| H03K 17/687 | (2006.01) |
| H03K 17/06 | (2006.01) |
| G01R 27/14 | (2006.01) |
| G01R 19/00 | (2006.01) |

(52) U.S. Cl.
CPC ......... *G05F 3/262* (2013.01); *G01R 19/0084* (2013.01); *G01R 27/14* (2013.01); *H03K 17/063* (2013.01); *H03K 17/687* (2013.01)

(58) Field of Classification Search
None
See application file for complete search history.

(56) References Cited

U.S. PATENT DOCUMENTS

| 5,220,207 A * | 6/1993 | Kovalcik | ................ G05F 1/561 327/63 |
| 5,815,027 A * | 9/1998 | Tihanyi | .............. G01R 19/0092 327/543 |
| 5,986,441 A * | 11/1999 | Koroncai | ......... G01R 19/16519 327/52 |
| 6,323,703 B1 * | 11/2001 | Fotouhi | ............ H03K 19/00315 327/112 |
| 6,600,362 B1 | 7/2003 | Gavrila | |
| 7,202,711 B2 * | 4/2007 | Gose | .................. G01R 19/0092 327/108 |

(Continued)

FOREIGN PATENT DOCUMENTS

| DE | 10258766 A1 | 7/2004 |
| DE | 102015114034 A1 | 3/2016 |

*Primary Examiner* — Kenneth B Wells
(74) *Attorney, Agent, or Firm* — NORTON ROSE FULBRIGHT US LLP; Gerard Messina (57) ABSTRACT

A method and an integrated circuit for limiting a switchable load current. The integrated circuit includes a main transistor, through which in the conductive state a load current flows for supplying a load and a mirror transistor, a gate terminal of the mirror transistor being electrically connected to a gate terminal of the main transistor and a source terminal of the mirror transistor being electrically connected to a source terminal of the main transistor. The integrated circuit further includes a coupling circuit, which is configured to track a source drain voltage of the mirror transistor as a function of the source drain voltage of the main transistor. A gate control circuit is further provided, which limits the load current through the main transistor on the basis of a drain current through the mirror transistor.

11 Claims, 6 Drawing Sheets

(56) References Cited

U.S. PATENT DOCUMENTS

| | | | |
|---|---|---|---|
| 8,325,451 B2* | 12/2012 | Mitsuda | H03K 17/0822 361/93.1 |
| 8,598,859 B2* | 12/2013 | Furuichi | H03K 17/0822 323/284 |
| 8,624,379 B2* | 1/2014 | Nakamura | H01L 27/088 257/E23.079 |
| 9,360,879 B2* | 6/2016 | Levhar | G05F 3/02 |
| 10,031,164 B2* | 7/2018 | Takada | H01L 29/7815 |
| 2004/0164786 A1 | 8/2004 | Yamamoto et al. | |
| 2007/0115741 A1 | 5/2007 | Jung et al. | |
| 2016/0356817 A1 | 12/2016 | Sievert et al. | |
| 2017/0089957 A1 | 3/2017 | Takada et al. | |

* cited by examiner

Fig. 1

PRIOR ART

INTEGRATED CIRCUIT AND METHOD FOR LIMITING A SWITCHABLE LOAD CURRENT

FIELD

The present invention relates to an integrated circuit and a method for limiting a switchable load current.

BACKGROUND INFORMATION

In an ASIC, application-specific integrated circuit, switches are often used, which are intended to switch electrical load currents for supplying loads. A switch in this case may, for example, be implemented by an MOS transistor which, when suitably activated, connects two load terminals to one another with a low impedance or separates them from one another with a high impedance. The switch in this case is dimensioned according to the load to be switched. In the switched-on state, it must have the required conductivity, i.e., it must be able to provide the current required by the load. Due to the finite conductivity or of the invariably present series resistance, a power loss occurs, which must be dissipated. Even the ampacity of the electronic packaging such as, for example, bond wires, housing metallization, strip conductors, plug contacts or lines must also be appropriately dimensioned in order to be able to carry the maximally occurring current.

To satisfy economic considerations, the components involved are typically dimensioned only to the limit of the functional range. Thus, in the event of a fault, for example, in the case of a short circuit or of a load, which was of lower impedance than intended, a current limitation is carried out. In this way a thermal destruction of the switch or of components associated with the electronic packaging is prevented.

For the purpose of current limitation or switching-off, it is necessary to detect the current, which flows through the switch in the conductive state.

Figure 1:
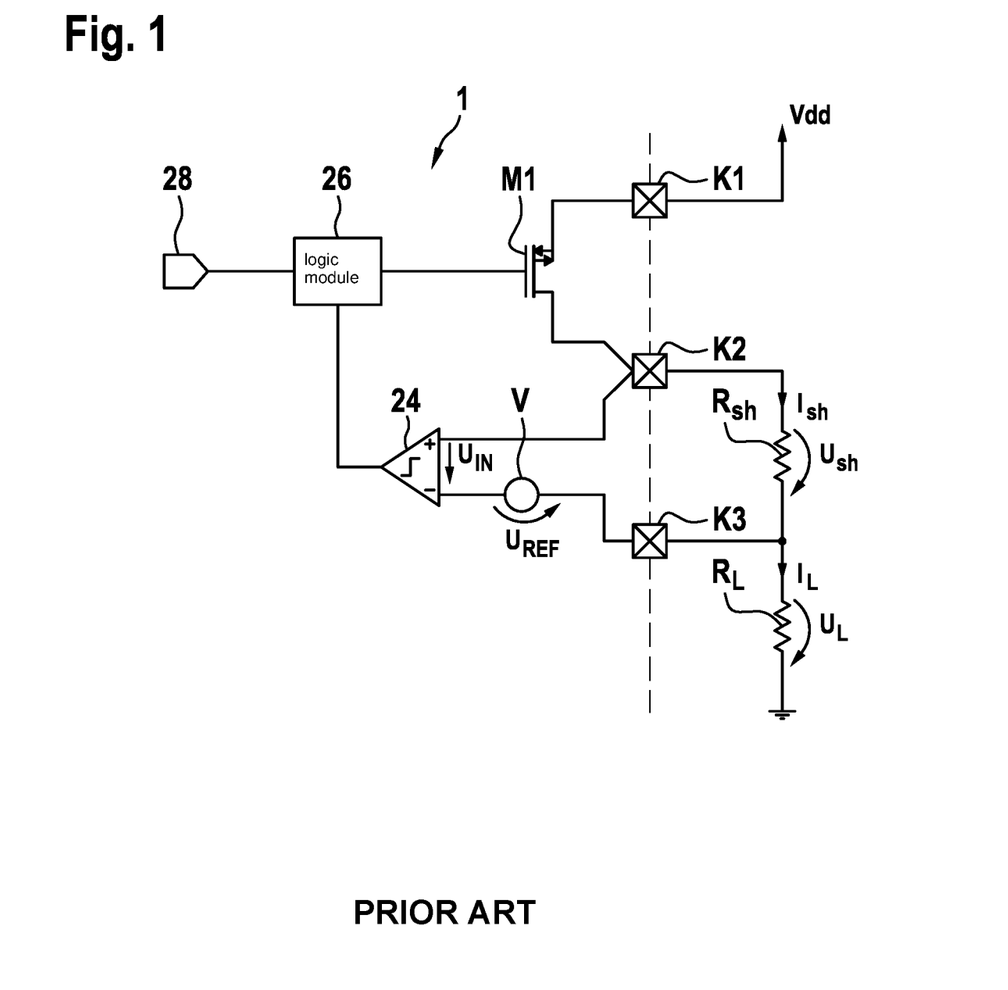
FIG. 1 shows an integrated circuit for limiting a switchable load current according to the prior art.

FIG. 1 shows for this purpose a typical integrated circuit 1 for limiting a switchable load current according to the related art. The current, generated by a supply source $V_{DD}$, which flows through transistor M1, is conducted via a shunt resistor $R_{sh}$ situated in series to transistor M1, at the two terminals of which, for example, at contacts K2 and K3, a voltage drop $U_{sh}$ occurs.

This voltage drop $U_{sh}$ may be converted with the aid of Ohms law and based on the knowledge of shunt resistor $R_{sh}$ to current $I_{sh}$, which flows through shunt resistor $R_{sh}$ and thus also through transistor M1. This results, in particular, in $I_{sh}=U_{sh}/R_{sh}$.

Further details of integrated circuit 1 are described below. A gate terminal of transistor M1 may be activated via a control input 28 in such a way that transistor M1 is brought into a conductive state. In the conductive state, the drain terminal and the source terminal are connected with low impedance to one another by the formation of a conductive channel. The activation may take place via a logic module 26 and optionally via a driver, the latter not being specifically shown here.

A load current $I_L$, which flows through load resistor $R_L$, corresponds as a good approximation, i.e., disregarding those currents that flow into comparator 24, to current $I_{sh}$ through shunt resistor $R_{sh}$. Accordingly, $I_{sh} \approx I_L$ applies. A voltage $U_{in}=R_{sh}I_{sh}-U_{ref} \approx R_{sh}I_L-U_{ref}$ is therefore present at the input of comparator 24.

In the event that load current $I_L$ is at zero, the output of comparator 24 in this purely exemplary logic is at LOW. If load current $I_L$ exceeds value $U_{ref}/R_{sh}$, then the output of comparator 24 is drawn to HIGH. A gate controller, including in this case a logic module 26, for example, may cause the gate of transistor M1 to be activated in such a way that transistor M1 blocks and accordingly separates with high-impedance its drain terminal and source terminal from one another.

The disadvantage, however, is that the more exactly the current is to be detected the more exact the design of shunt resistor $R_{sh}$ must be. It may be placed in the system as an external component outside circuit 1, i.e., outside the ASIC, or else integrated within circuit 1, i.e., in the ASIC. External shunt resistors $R_{sh}$ may be very exactly designed, but require a large amount of space on the circuit board and result in additional costs.

If the shunt resistor is integrated in circuit 1, then, without a time-consuming adjustment, only minimal accuracies are achieved however. Furthermore, an additional voltage drop $U_{sh}$ occurs over shunt resistor $R_{sh}$, which increases the total resistance from transistor M1 and shunt resistor $R_{sh}$. This generates an additional power loss to be dissipated in the system or in the circuit, i.e., in the ASIC.

The smaller the design of shunt resistor $R_{sh}$ is, the smaller are these power losses. As a result, however, the signal evaluation of the then very small voltage drop $U_{sh}$ over shunt resistor $R_{sh}$ becomes more complicated. This then generally requires the use of very exact amplifier circuits. In addition, the requirement of sufficient bandwidth must be provided, so that in the event of an excessively high current intensity, it is possible to initiate appropriately rapid countermeasures. The destruction previously described above must, in particular, be prevented from occurring.

SUMMARY

According to the present invention, an integrated circuit for limiting a switchable load current is provided. In accordance with an example embodiment of the present invention, the integrated circuit in this case includes a main transistor switchable between a conductive state and a non-conductive state. In the conductive state, a load current flows through this main transistor for supplying a load. The integrated circuit further includes a mirror transistor, a gate terminal of the mirror transistor being electrically connected to a gate terminal of the main transistor and a source terminal of the mirror transistor being electrically connected to a source terminal of the main transistor. The integrated circuit further includes a coupling circuit, which is electrically connected to drain terminals of the main transistor and of the mirror transistor and is configured to track a source drain voltage of the mirror transistor as a function of the source drain voltage of the main transistor. The integrated circuit further includes a gate control circuit, which is electrically connected to the gate terminal of the main transistor and is configured to limit the load current through the main switch on the basis of a drain current through the mirror transistor.

The transistors used may, in particular, be MOS transistors. The principle is also applicable to JFET transistors or bipolar transistors. P-channel transistors as well as N-channel transistors may further be used, in particular, PMOS transistors or else also NMOS transistors. The term coupling circuit is understood to mean a circuit area or also individual circuit elements, which makes the source drain voltage of the mirror transistor dependent on the source drain voltage of the main transistor. Tracking means in other words an adapting of the source drain voltage. This means that the source drain voltage of the main transistor is transferred to the mirror transistor, i.e., in particular, that a change in the source drain voltage of the main transistor results in a corresponding change in the source drain voltage. A dependency is preferably implemented by $U_{sd2}=U_{sd1}+U_{offs}$, where $U_{offs}$ may be positive, negative or also identical to zero. The main transistor is operated in the triode range or in the linear range. A mirror transistor is in other words a secondary transistor connected as described above. The current of the mirror transistor is thus a scaled-down copy, or a scaled-down mirror image, of the current of the main transistor. The source drain current, or drain current, of the mirror transistor is, at least in a load current range, proportional to the load current. The control of the gate terminal takes place, in particular, when the drain current through the mirror transistor has reached a particular threshold value. This threshold value corresponds to the maximum load current that may be conducted through the main switch.

The present invention may have an advantage that an external component such as the shunt resistor may be saved or that also no adjustment of an internal shunt resistor is necessary. As a result, the additional voltage drop over the shunt resistor is also omitted, so that no additional power loss through a shunt occurs and, consequently, neither is the facilitation of any additional heat dissipation required. The total resistance of the switch is reduced approximately by the value of the saved shunt resistor. To achieve a required total resistance, the main transistor could also be designed to be smaller. Furthermore, the evaluation electronics are simplified. Specifically, the present invention makes it possible by coupling the drain source voltages, and by the tracking and the wiring of the gate and source terminals for a current to be conducted through the mirror transistor, which is proportional to the load current through the main switch. As a result, the mirror transistor represents a mirrored version, or a copy of the main transistor. Thus, by detecting the drain current through the mirror transistor, it is possible to deduce or to detect the load current through the main switch and to limit the load current on the basis of this current flowing through the mirror transistor.

Advantageous refinements of the present invention are disclosed herein.

According to an example embodiment of the present invention, a width-to-length ratio of the main transistor compared to a width-to-length ratio of the first secondary transistor is preferably greater by a factor $\alpha \geq 1$, preferably $\alpha \geq 10$, even more preferably $\alpha \geq 100$. A reduced copy of the main transistor is generated as a result. Thus, only a very small current, in particular, will flow through the mirror transistor corresponding to factor $\alpha$ in relation to the main transistor. For example, the current intensity may be 1 mA, whereas the load current is 1 A in the case of $\alpha=1000$.

The coupling circuit preferably includes a first secondary transistor, which is connected in series to the mirror transistor. The coupling circuit further includes a second secondary transistor, which is diode-connected and connected in series to the main transistor, a gate terminal of the second secondary transistor being electrically connected to a gate terminal of the second secondary transistor. The coupling circuit may further include a first current sink connected to the drain terminal of the second secondary transistor. The first current sink may, for example, be formed by a transistor. The current intensity in this case is permanently preset. The second secondary transistor, in which the gate terminal and the drain terminal are connected, is always in the saturation range and a gate source voltage occurs as a result of the current sink. This wiring ensures an automatic tracking of the source drain voltages of the mirror transistor as a function of the source drain voltage of the main transistor, in particular, the source drain voltages may be identically set, i.e., the drain potentials may have the same value. Alternatively, the drain source voltages may also differ from one another by an offset, which may be negative or positive. The described implementation of the voltage coupling with the aid of transistors has the advantage that only a very minimal amount of circuitry is required to be operated.

In one preferred specific example embodiment of the integrated circuit of the present invention, a width-to-length ratio of the first secondary transistor differs from a width-to-length ratio of the second secondary transistor by a factor $\beta$. Thus, for $\beta \neq 1$ a further optimization parameter results for improving the dimensioning of the integrated circuit and for setting operating points of the transistors. With the aid of this factor, it is possible to implement the above-described offset, see $U_{offs}$ above.

According to an example embodiment of the present invention, the coupling circuit preferably includes a first secondary transistor, which is connected in series to the mirror transistor. The integrated circuit further includes a first operational amplifier, inputs of the first operational amplifier being electrically connected to the drain terminals of the main transistor and of the mirror transistor, and an output being electrically connected to the gate terminal of the first secondary transistor. This may ensure that an automatic coupling of the source drain voltages occurs between the main transistor and the mirror transistor. By adjusting the input difference to 0V, it is possible to generate, in particular, the uniformity of the drain source voltages. A very exact or precise setting of the potentials, in particular, may be carried out by the operational amplifier.

The coupling circuit is preferably configured to set the source drain voltage of the mirror transistor with the source drain voltage of the main transistor to an identical value. This may take place in each case with the aid of the two upper coupling circuits, this dependency in the coupling circuit on the two secondary transistors being achieved in the case of $\beta=1$, and the use of the operational amplifier being consistently fulfilled. In this case, identical potentials are present at the mirror transistor.

The integrated circuit preferably includes a measuring resistor, which is connected in series with the drain terminal of the first secondary transistor, and the gate control circuit including a second operational amplifier and which is configured to regulate the gate terminal of the main transistor on the basis of the difference between a measured voltage over the measuring resistor and a reference voltage. With the aid of this wiring, a control loop is described. The limitation thus corresponds in this case to a regulating, i.e., a further increase of a load current beyond a regulating point, i.e., beyond a maximum load current, is prevented, i.e., limited. The regulating in this case takes place when a drain current through the mirror transistor reaches a threshold value. At this threshold value, the maximum load current flows through the main transistor. As a result, a control loop is implemented, in which with the aid of the current path through the mirror transistor, a maximum load current through the main transistor is not exceeded.

The integrated circuit preferably includes a second current sink, which is electrically connected to a drain terminal of the first secondary transistor, and the gate control circuit including a comparator and being configured to switch the main switch into a non-conductive state when the drain current through the mirror transistor is greater than the current value of the second current sink. In this way, it is possible to establish a fixed switch-over point with the aid of the detection of the drain potential. Thus, in the event of a fault, a hard switch-off may be generated. The advantage is that the circuit may be immediately protected in the case of overcurrent and damage to circuit components may thus be reduced. The switch-off in this case takes place when a drain current through the mirror transistor reaches a threshold value. At this threshold value, the maximum load current flows through the main transistor.

The method according to an example embodiment of the present invention for limiting a switchable load current includes the following steps: In a first step, the provision of a mirror transistor and of a main transistor switchable between a conductive state and a non-conductive state takes place, through which in the conductive state a load current flows for supplying a load. In this case a gate terminal of the mirror transistor is electrically connected to a gate terminal of the main transistor and a source terminal of the mirror transistor is electrically connected to a source terminal of the main transistor. In one further step, the method includes the tracking of a source drain voltage of the secondary transistor as a function of the source drain voltage of the main transistor. In one further step, the limiting of the load current through the main switch takes place on the basis of a drain current through the mirror transistor.

Here, the same advantages apply as with respect to the above-described integrated circuit.

According to an example embodiment of the present invention, the method for limiting a switchable load current preferably includes a regulating or a switching off of the load current. Thus, an overcurrent, for example, in the event of a fault, may be prevented in various ways from flowing through the main transistor.

BRIEF DESCRIPTION OF THE DRAWINGS

Exemplary embodiments of the present invention are explained in greater detail below with reference to the figures and to the following description.

DETAILED DESCRIPTION OF EXAMPLE EMBODIMENTS

Figure 2:
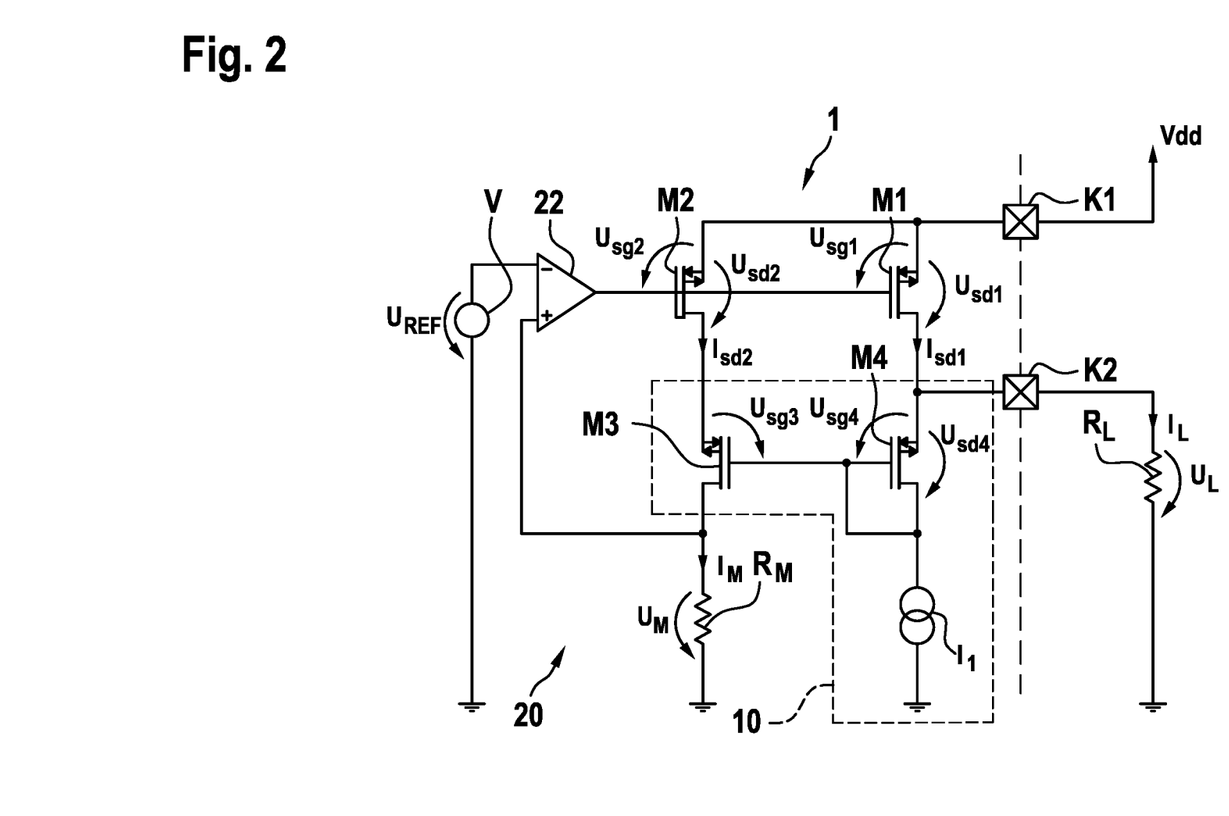
FIG. 2 shows an integrated circuit for limiting a switchable load current according to one first specific example embodiment of the present invention.

An integrated circuit 1 for limiting a switchable load current according to one first specific embodiment of the present invention is shown in FIG. 2. Integrated circuit 1 includes a main transistor M1. Main transistor M1 is used to switch a load current for supplying an (external) load $R_L$, which is represented here by a resistor. A source terminal of main transistor M1 is connected in this case with a first contact K1 and with a second contact K2 to an external electric line, in particular, to a supply voltage Vdd. First contact K1 in this example is present at a positive supply voltage Vdd. Load $R_L$ is correspondingly connected in series to main transistor M1.

Main transistor M1 is switchable between a conductive state, i.e., a low impedance state, and a non-conductive state, i.e., a high-impedance state. In the conductive state, a load current $I_L$ essentially flows through main transistor M1. Thus, this corresponds to drain source current $I_{sd1}$ over the source drain path of main transistor M1, i.e., $I_L \approx I_{sd1}$.

Integrated circuit 1 further includes a mirror transistor M2. Mirror transistor M2 is connected in parallel with main transistor M1 with respect to its source-drain path. A gate terminal of mirror transistor M2 is electrically connected to a gate terminal of main transistor M1. Furthermore, a source terminal of mirror transistor M2 is electrically connected to a source terminal of main transistor M1. The wiring ensures that the source gate voltage of the two transistors M1, M2 is identical, i.e., $U_{sg2}=U_{sg1}$. Main transistor M1 in this case is operated in the linear range, i.e., in the triode range. In this operating state, its source drain current $I_{sd1}$ is not determined alone by source gate voltage $U_{SG1}$, but primarily also by source drain voltage $U_{SD1}$.

Integrated circuit 1 further includes a coupling circuit 10. The dashed lines in FIG. 2 indicating coupling circuit 10, as in the further figures, serve merely to better illustrate integrated circuit 1. Coupling circuit 10 is electrically connected to the drain terminals of main transistor M1 and mirror transistor M2. Coupling circuit 10 is configured so as to track or to set a source drain voltage $U_{sd2}$ of mirror transistor M2 as a function of source drain voltage $U_{sd1}$ of main transistor M1. In other words, source drain voltage $U_{usd1}$ of main transistor M1 is forced over, or transferred to, mirror transistor M2. This dependency is preferably (in a first approximation) the following: $U_{sd2}=U_{sd1}+U_{offs}$, where $U_{offs}$ may be positive, negative or 0. In particular specific embodiments, $U_{sd2}=U_{sd1}$ is preferred. The result of this dependency is that drain current $I_{sd2}$ through mirror transistor M2 is, at least in a load current range, proportional to drain current $I_{sd1}$ through main transistor M1. Drain current $I_{sd2}$ through mirror transistor M2 thus represents a measure for the current flowing through main transistor M1. If drain current $I_{sd1}$ through main transistor M1 increases, then drain current $I_{sd2}$ through mirror transistor M2 increases accordingly. Preferred specific embodiments of the coupling circuits are described in the further figures.

A width-to-length ratio of main transistor M1 compared to a width-to-length ratio of mirror transistor M2 is greater by a factor $\alpha>1$, preferably $\alpha \geq 10$, even more preferably $\alpha \geq 100$. This means, if first main transistor M1 has a width-to-length ratio of $W_a/L_a$, then mirror transistor M2 preferably has a width-to-length ratio of $\alpha W_a/L_a$. At the same voltage $U_{sd2}=U_{sd1}$, such a dimensioning is the result of drain current $I_{sd2}$ being less than drain current $I_{sd1}$ by a factor $\alpha$. As a result, a correspondingly smaller proportional current may be conducted in the current path through mirror transistor M2. A factor $\alpha \geq 100$ is, in particular, advantageous, since as a result only a small current is branched off from main transistor M1. Mirror transistor M2 may thus be dimensioned to be correspondingly small.

Integrated circuit 1 further includes a gate control circuit 20. Gate control circuit 20 is electrically connected to the gate terminal of main transistor M1, or electrically connected to the shared gate terminal. With the aid of gate control circuit 20, it is possible to control, in particular, automatically control the gate voltage at main transistor M1. Gate control circuit 20 limits the load current through main switch M1 on the basis of the drain current through mirror transistor M2. The drain current through mirror transistor M2 is, as described above, proportional to the load current. As a result, a limitation may be carried out with the aid of the detection of this diverted current. Preferred examples thereof are described in greater detail below.

In the preferred specific embodiment described herein, coupling circuit 10 includes a first secondary transistor M3. First secondary transistor M3 is connected in series with mirror transistor M2. In other words, the source terminal of first secondary transistor N3 is electrically connected to the drain terminal of mirror transistor M2.

Coupling circuit 10 in this particular embodiment further includes a second secondary transistor M4. Second secondary transistor M4 is diode-connected, i.e., it is configured as a transistor interconnected as a diode. Its gate terminal and drain terminal are thus electrically connected to one another. Second secondary transistor M4 is thus consistently in the saturation range. Second secondary transistor M4 is further connected in series to main transistor M1. This means in other words that the drain terminal of main transistor M1 is electrically connected to the source terminal of second secondary transistor M4. A gate terminal of first secondary transistor M3 is further electrically connected to a gate terminal of second secondary transistor M4. Coupling circuit 10 further includes a current sink $I_1$, which is connected to the drain terminal of second secondary transistor M4. This wiring ensures that a source gate voltage $U_{sg4}$ is generated for second secondary transistor M4 according to established value $I_s$ of first current sink $I_1$. First current sink $I_1$ may, for example, be designed as a further transistor.

Coupling circuit 10 enables a voltage coupling of the drain potentials. Mirror transistor M2 may, in particular, be operated via the voltage coupling in such a way that source drain voltage $U_{sd2}$ of mirror transistor M2 is adapted as a function of source drain voltage $U_{sd1}$ of main transistor M1. With similar dimensioning of secondary transistors M3, M4, in particular, drain source voltages $U_{sd2}$ and $U_{sd1}$ may be considered to be equivalent. The circuit complexity of this wiring is advantageously minimal.

A width-to-length ratio of first secondary transistor M3 compared to a width-to-length ratio of second secondary transistor M4 may further include a factor $\beta$, in particular, may be $\beta \neq 1$. This means, if first secondary transistor M3 has a width-to-length ratio of $W_b/L_b$, then second secondary transistor M4, may have a width-to-length ratio $\beta W_b/L_b$. For example, $\beta$ may be a lighter correction value such as for example, in the range of 0.1 to 10 and may be used for the operation point correction or operation point optimization. As a result, the electrical circuit includes a further degree of freedom for dimensioning. Thus, via the factor beta, an offset, i.e., an offset voltage $U_{offs}$, may be implemented. On the whole, source gate voltage $U_{sg3}$ and thus also source drain voltage $U_{sd2}$ of mirror transistor M2 may be a function of the drain current of mirror transistor $I_{sd2}$.

Integrated circuit 1 further includes a measuring resistor $R_m$, which is connected in series with the drain terminal of first secondary transistor M3. Thus, a measured current $I_M$, which corresponds to drain current $I_{sd2}$ and is thus proportional to the load current through mirror transistor M2, flows through measuring resistor $R_m$.

Gate control circuit 20 in this embodiment includes an operational amplifier 22. A positive input of operational amplifier 22 in this case may be connected to the drain terminal of second secondary transistor M4. Thus, measured voltage $U_M$ over measuring resistor $R_m$ is present at this input. A negative input may be set to a reference voltage $V_{ref}$, for example, with the aid of a voltage source V. The output of operational amplifier 22 may further be electrically connected to the gate terminal of first main transistor M1. Thus, a control circuit is implemented on the basis of drain current $I_{sd2}$ through mirror transistor M2. In further specific embodiments of the present invention, a timer circuit is provided, which will achieve a complete switch-off after a particular period of time, in which the maximum load current is flowing. This avoids an operation in the event of a permanent fault.

Operational amplifier 22 is further configured to regulate the gate terminal of main transistor M1 on the basis of the difference between measured voltage $U_m$ across measuring resistor $R_m$ and reference voltage $U_{ref}$, so that measured voltage $U_m = U_{ref}$ is set. In this way, maximum load current $I_{Lmax}$ in this embodiment is established. This maximum load current $I_{Lmax}$ may thus be established on the basis of $U_{ref}$, $R_m$, factors $\alpha$ and $\beta$, and current $I_s$ of current sink $I_1$.

The described specific embodiment will be further discussed below with reference to illustrative examples, the present invention not being limited to these examples.

Measured current $I_M$ through measuring resistor $R_M$ is proportional to load current $I_L$. The proportionality factor is determined by the establishment of coefficients $\alpha$ and $\beta$ and by the establishment of current $I_1$. For $\beta=1$ and $I_1=I_L$, for example, $I_{sd2}=I_{sd1}/\alpha$ or $I_M=I_L/\alpha$ is applicable.

For example, the current of current sink $I_1$ may be set to maximum load current $I_{Lmax}$: $I_s=I_{Lmax}/\alpha$. With the aid of factor $\beta$, ratio $I_L/I_M$ may be selected to be greater or smaller than $\alpha$ according to the generally known dependency of the drain source or source drain current of a MOS transistor on its drain source or source drain voltage in the triode range or in the linear range. This offers an additional degree of freedom in the dimensioning of the circuit.

Reference voltage $U_{REF}$ of voltage source V thus determines, together with the choice of measuring resistor $R_M$, coefficients $\alpha$ and $\beta$ and the choice of current $I_1$, maximum load current $I_{Lmax}$, which may flow through main transistor $M_1$ operating as the switch. For $\beta=1$, $I_s=I_{Lmax}/\alpha 0$ and $R_M=U_{REF}/I_s$, for example, $I_{Lmax}/\alpha=U_{REF}/R_M$ is applicable.

Figure 3:
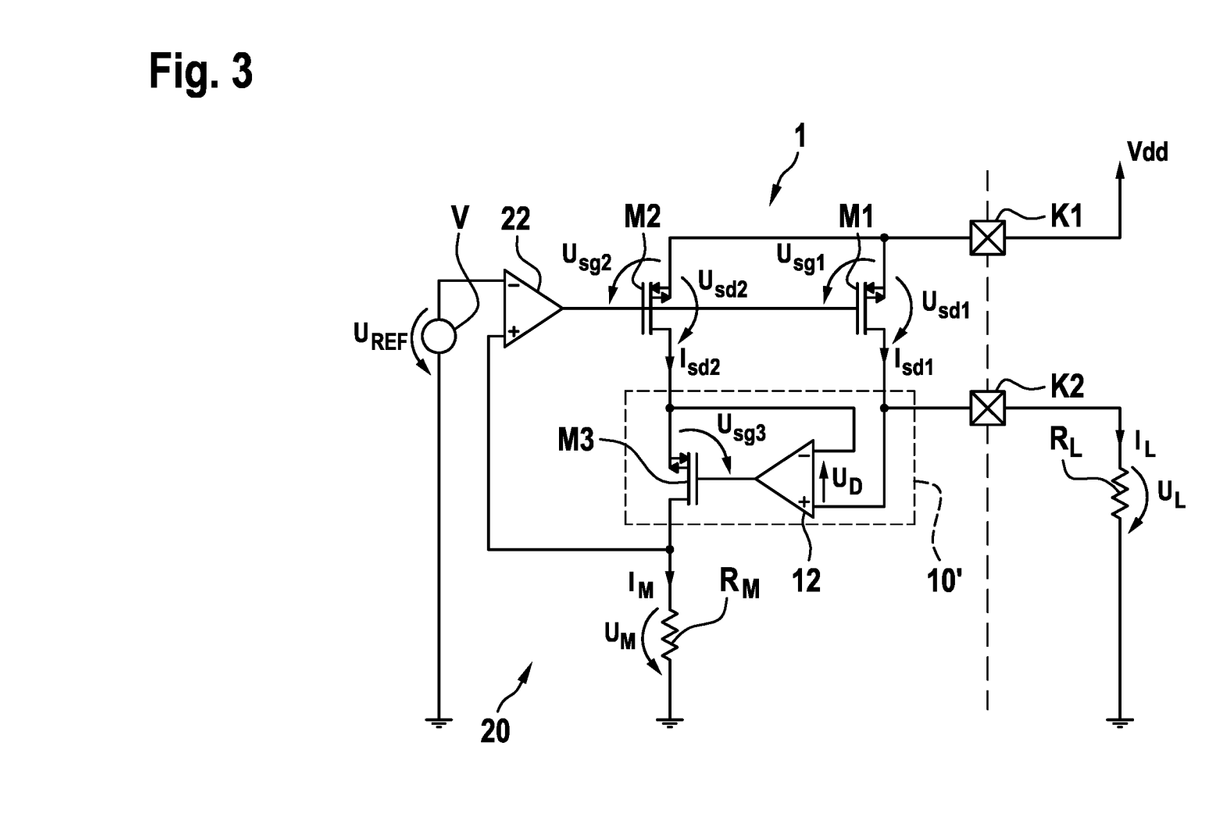
FIG. 3 shows an integrated circuit for limiting a switchable load current according to one second specific example embodiment of the present invention.

FIG. 3 shows an integrated circuit 1 according to one second specific embodiment. This specific embodiment is also a control circuit as described previously in FIG. 2. Only the differences with respect to FIG. 2 are described in greater detail below. For the similarities, reference is made to the description in FIG. 2.

In this specific embodiment, coupling circuit 10' also includes a first secondary transistor M3, which is connected in series with mirror transistor M2. Coupling circuit 10' further includes a first operational amplifier 12, inputs of first operational amplifier 12 being electrically connected to the drain terminals of main transistor M1 and mirror transistor M2. In this specific example, a positive input of first operational amplifier 12 is electrically connected to the drain terminal of main transistor M1 and a negative input is connected to the drain terminal of mirror transistor M2. An output is electrically connected to the gate terminal of first secondary transistor M3. This embodiment has the advantage that a very exact setting of the drain source voltage or of the drain potentials at mirror transistor M2 may take place.

First operational amplifier 12 activates the gate terminal of first secondary transistor M3 in such a way that for mirror transistor M2, the same source drain voltage $U_{sd2}$ results as for main transistor M1. This is achieved by first operational amplifier 12 adjusting its differential input voltage $U_D=U_{sd2}-U_{sd1}$ between its positive and its negative input to $U_D=0V$. Thus, in this specific embodiment, $U_{sd2}=U_{sd1}$ is always applicable. The setting of maximum load current $I_{Lmax}$ as a regulating point again takes place via the choice of measuring resistor $R_M$, coefficient $\alpha$ as well as width-to-length ratio W/L of first secondary transistor M3. For further details, reference is made to the description for FIG. 2, which applies here as well.

Figure 4:
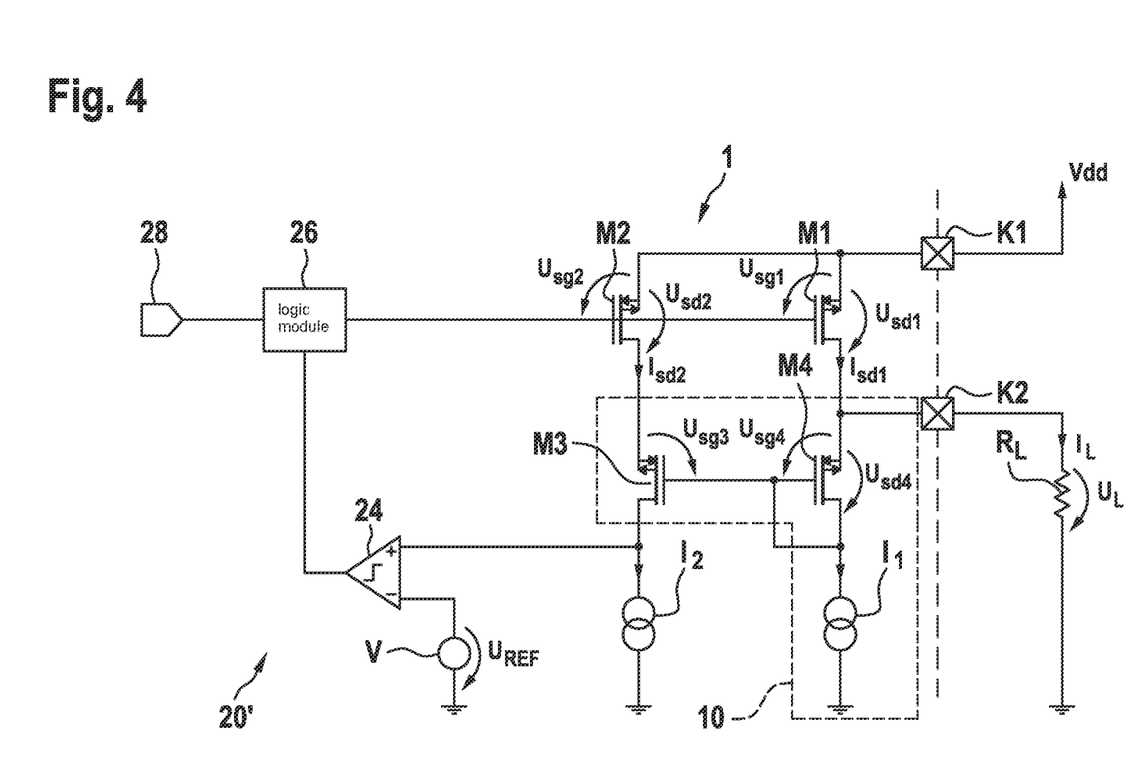
FIG. 4 shows an integrated circuit for limiting a switchable load current according to one third specific example embodiment of the present invention.

FIG. 4 shows an integrated circuit 1 according to one third specific embodiment of the present invention. In this specific embodiment, no regulation of the load current takes place, rather a switch-off of the load current is implemented circuitry-wise. Coupling circuit 10 in this case is designed similarly to the embodiment described in FIG. 2. Thus, only the differences with respect to FIG. 2 are described and for similarities, reference is made to FIG. 2. These similarities, which are not expressly mentioned, may, however, also be applied here in specific embodiments of the present invention.

The integrated circuit further includes a second current sink $I_2$. This second current sink $I_2$ is electrically connected in this case to a drain terminal of first secondary transistor M3. Gate control circuit 20' in this exemplary embodiment includes a comparator 24. Gate control circuit 20' with comparator 24 switches the gate terminal in this case into a non-conductive state when drain current $I_{sd2}$ through mirror transistor M2 is greater than the current value of second current sink $I_2$, identified in the figure by way of example with $\gamma I_s$, the present invention not being limited to a particular value of $\gamma$.

A positive input of comparator 24 in this case is connected to the drain terminal of first secondary transistor M3. A negative input is set to a reference voltage $U_{ref}$. This may take place with the aid of an additional voltage source V. Thus, comparator 24 switches over when the voltage at the drain terminal is drawn above reference voltage $U_{ref}$. In the present specific embodiment, this occurs when drain current $I_{sd2}$ through mirror transistor M2 which, as a result of the coupling circuit, is proportional to load current $I_L$ through main transistor M1, is greater than the current value of second current sink $I_2$. Gate control circuit 20' may then switch the gate terminal into a non-conductive state. The current sink thus serves to establish a switch-over point on the basis of electrical currents, in particular, on the basis of scaled current $I_{sd2}$ through mirror transistor M2. The proportionality of drain current $I_{sd2}$ to the load current is thus utilized in order to define a switch-off point.

This will be described by way of example below for illustrative purposes. The gate terminals of secondary transistors M3, M4 are electrically connected to one another. In this way, it is possible, given a suitable choice of the width-to-length ratios $W_a/L_a$ of main transistor M1 or $W_b/L_b$ of second secondary transistor M4, and of coefficients $\alpha$, $\beta$, and $\gamma$, to very exactly set in which load current $I_L$ secondary transistor M3 and M4 have the same source gate voltage $U_{sg3}$ and $U_{sg4}$. Secondary transistors M3 and M4 may then occupy the same operating point. As a result, source drain voltages $U_{sd3}$ and $U_{sd4}$ of the two secondary transistors M3 and M4 may also be identical. However, it is emphasized here that because the present invention is not dependent on one specific choice of parameters, an exact dimensioning of circuit 1 may take place.

The significance of second current sink $I_2$ is described in greater detail below. Current sink $I_2$ may, for example, dissipate current $I_2=\gamma I_s$, for example, when $\beta \neq 1$. In specific embodiments, $\gamma$ may also assume the value 1. Given a suitable choice of the width-to-length ratios $W_a/L_a$ or $W_b/L_b$ as well as of coefficients $\alpha$, $\beta$, and $\gamma$, mirror transistor M2 may provide current $I_{Lmax}/\alpha$ according to the width-to-length ratio $\alpha$ of M1 and M2 directly approximate to the switch-over point of comparator 12. $I_{Lmax}$ in this case corresponds to the maximum allowable load current through main transistor M1 adjustable with the aid of the circuit parameters.

In the event that load current $I_L<I_{Lmax}$, equivalent to $I_{sd2}<\gamma I_s$, first secondary transistor M2 is unable to provide the current that current sink $I_2$ is able to dissipate. Consequently, the result is $U_{SG3}<U_{SG4}$ and the positive input of comparator 12 is drawn to ground by current sink $I_2$. In such a case, the output of comparator 12 would be, for example, LOW for $I_L<I_{Lmax}$ or for $I_{sd2}<\gamma I_s$.

If load current is $I_L>I_{Lmax}$, equivalent to $I_{sd2}>\gamma I_s$, first secondary transistor M2 is able to provide more current than current sink $I_2$ is able to dissipate. This therefore results in $U_{SG3}>U_{SG4}$ and the positive input of comparator 12 is drawn by mirror transistor M2 and first secondary transistor M3 to positive supply voltage $V_{DD}$ via reference voltage $U_{REF}$ of voltage source V1. As a result, the output of comparator 12, given a suitable choice of reference voltage $U_{REF}$, is accordingly able to go to HIGH. An advantageous switch-off in the case of overcurrent may thus take place with the aid of the current path through mirror transistor M2.

Figure 5:
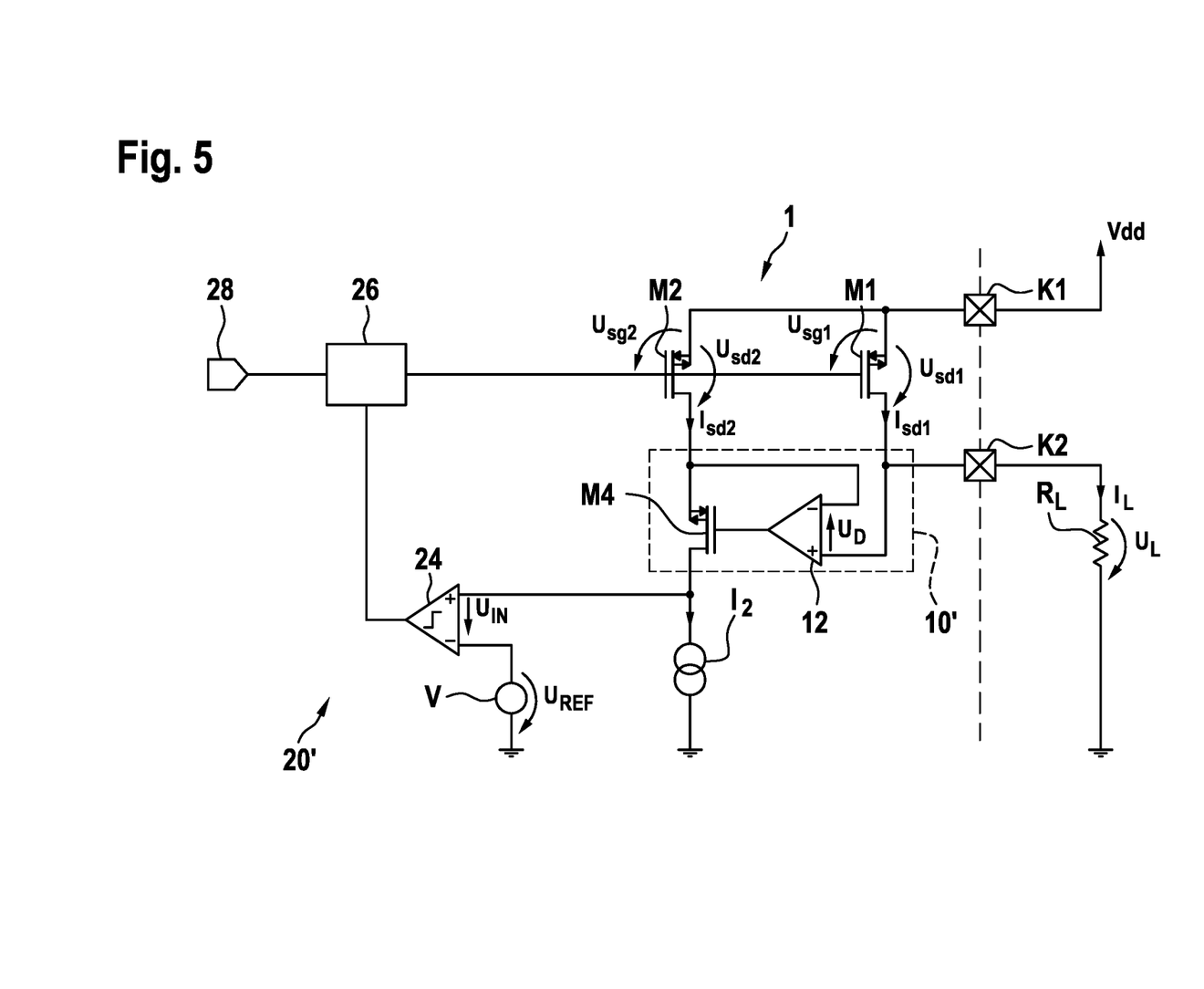
FIG. 5 shows an integrated circuit for limiting a switchable load current according to one fourth specific example embodiment of the present invention.

The previous explanations are described merely for illustrating the present invention and limit the present invention neither to a PMOS logic, since the circuit may also be designed with NMOS transistors, nor to a particular selection of parameters. The dimensioning parameters in this case may be used for the optimization of the circuit and for the exact setting of $I_{Lmax}$. An integrated circuit 1 according to one fourth specific embodiment of the present invention is shown in FIG. 5. The specific embodiment also describes a switch-off of main transistor M1 in the case of an excessively high load current as in FIG. 4. In contrast to FIG. 4, however, a coupling circuit 20' described similarly to FIG. 3 is described. Thus, reference is made to the description content of the previous figures.

In addition to first secondary transistor M3, which is connected in series with mirror transistor M2, coupling circuit 10' further includes a first operational amplifier 12, inputs of first operational amplifier 12 being electrically connected to the drain terminals of main transistor M1 and of mirror transistor M2. In this specific example, a positive input of first operational amplifier 12 is electrically connected to the drain terminal of main transistor M1 and the negative input is connected to the drain terminal of mirror transistor M2. An output is electrically connected to the gate terminal of first secondary transistor M3. This embodiment has the advantage that a current sink $I_1$ may be omitted.

The gate control circuit is identical to that of FIG. 4 and reference is made to the description content of FIG. 4 above.

Figure 6:
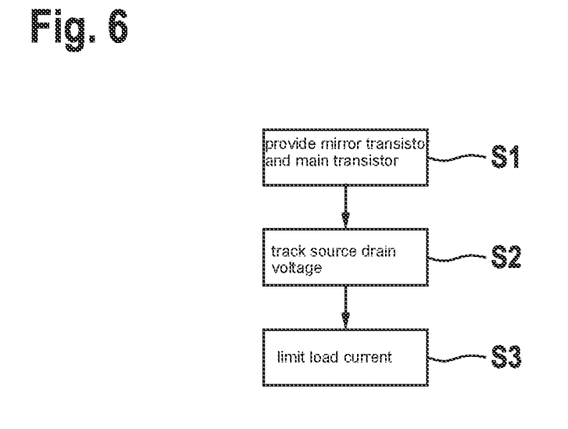
FIG. 6 schematically shows a method for limiting a switchable load current according to one specific example embodiment of the present invention.

A method for limiting a switchable load current is further schematically described in FIG. 6. In a first step S1, the method includes the provision of a mirror transistor M2 and of a main transistor M1 switchable between a conductive state and a non-conductive state, through which in the conductive state a load current $I_L$ for supplying a load $R_L$ flows. A gate terminal of mirror transistor M2 is electrically connected to a gate terminal of main transistor M1 and a source terminal of mirror transistor M2 is electrically connected to a source terminal of main transistor M1.

In a second step S2, the tracking of the source drain voltage $U_{sd2}$ of mirror transistor M2 takes place in a proportional dependence on source drain voltage $U_{sd1}$ of main transistor M1.

In a third step S3, the limiting of a load current through main transistor M1 takes place on the basis of a drain current through mirror transistor M2.

The limiting may be a regulating or a switch-off, see in this regard also the description relating to FIGS. 1 through 4. The advantages of the method result in this case from the portions of the description described above. Further steps of the method may be derived from the above sections of the description of integrated circuit 1.

In summary, a current limitation, in particular, a current regulation or current switch-off is described in the present invention, in which a required detection of the current in the form of a proportional current is implemented without a shunt. This is achieved in that a mirror transistor M2 represents preferably a scaled version or a scaled-down copy of main transistor M1, which is activated in the same manner as main transistor M1 itself. The voltage drop across the main transistor is detected with the aid of a coupling circuit 10, 10' and forced circuit-wise over scaled-down mirror transistor M2. This results in identical proportions, i.e., a proportionality for both main transistor M1 as well as for mirror transistor M2 both in the activation as well as with respect to the potentials. In this case, a shunt is omitted, but a precise detection of the current, which flows through main transistor M1, is nevertheless made possible. In addition, the evaluation electronics for limiting or switching off the load current are simplified.

Although the present invention has been illustrated and described in greater detail using preferred exemplary embodiments, the present invention is not limited by the described examples and other variations may be derived therefrom by those skilled in the art without departing from the scope of protection of the present invention.

What is claimed is:

1. An integrated circuit for limiting a switchable load current, comprising:
    a main transistor switchable between a conductive state and a non-conductive state, through which in the conductive state a load current flows for supplying a load;
    a mirror transistor, a gate terminal of the mirror transistor being electrically connected to a gate terminal of the main transistor, and a source terminal of the mirror transistor being electrically connected to a source terminal of the main transistor;
    a coupling circuit which is electrically connected to drain terminals of the main transistor and the mirror transistor and is configured to track a source drain voltage of the mirror transistor as a function of the source drain voltage of the main transistor; and
    a gate control circuit, which is electrically connected to the gate terminal of the main transistor and which is configured to limit the load current through the main transistor based on a drain current through the mirror transistor;
    wherein the coupling circuit includes:
        a first secondary transistor, which is connected in series with the mirror transistor; and
        a second secondary transistor, which is diode-connected and is connected in series with the main transistor, a gate terminal of the first secondary transistor being electrically connected to a gate terminal of the second secondary transistor;
        a first current sink connected to the drain terminal of the second secondary transistor.

2. The integrated circuit as recited in claim 1, wherein a width-to-length ratio of the main transistor compared to a width-to-length ratio of the mirror transistor is greater by a factor $\alpha > 1$.

3. The integrated circuit as recited in claim 2, wherein the factor is $\alpha \geq 10$.

4. The integrated circuit as recited in claim 2, wherein the factor is $\alpha \geq 100$.

5. The integrated circuit as recited in claim 1, wherein a width-to length ratio of the first secondary transistor differs from a width-to-length ratio of the second secondary transistor by a factor.

6. The integrated circuit as recited in claim 1, wherein the coupling circuit is configured to set the source drain voltage of the mirror transistor and the source drain voltage of the main transistor to be equal to each other.

7. An integrated circuit for limiting a switchable load current, comprising:
    a main transistor switchable between a conductive state and a non-conductive state, through which in the conductive state a load current flows for supplying a load;
    a mirror transistor, a gate terminal of the mirror transistor being electrically connected to a gate terminal of the main transistor, and a source terminal of the mirror transistor being electrically connected to a source terminal of the main transistor;
    a coupling circuit which is electrically connected to drain terminals of the main transistor and the mirror transistor and is configured to track a source drain voltage of the mirror transistor as a function of the source drain voltage of the main transistor; and
    a gate control circuit, which is electrically connected to the gate terminal of the main transistor and which is configured to limit the load current through the main transistor based on a drain current through the mirror transistor;
    wherein the coupling circuit includes:
        a first secondary transistor, which is connected in series with the mirror transistor; and
        a first operational amplifier, inputs of the first operational amplifier being electrically connected to the drain terminals of the main transistor and of the mirror transistor, and an output of the first operational amplifier being electrically connected to the gate terminal of the first secondary transistor.

8. An integrated circuit for limiting a switchable load current, comprising:
    a main transistor switchable between a conductive state and a non-conductive state, through which in the conductive state a load current flows for supplying a load;
    a mirror transistor, a gate terminal of the mirror transistor being electrically connected to a gate terminal of the main transistor, and a source terminal of the mirror transistor being electrically connected to a source terminal of the main transistor;
    a coupling circuit which is electrically connected to drain terminals of the main transistor and the mirror transistor and is configured to track a source drain voltage of the mirror transistor as a function of the source drain voltage of the main transistor; and
    a gate control circuit, which is electrically connected to the gate terminal of the main transistor and which is configured to limit the load current through the main transistor based on a drain current through the mirror transistor; and a measuring resistor, which is connected in series with the drain terminal of the first secondary transistor, wherein the gate control circuit includes a second operational amplifier which is configured to regulate the gate terminal of the main transistor based on a difference between a measured voltage across the measuring resistor and a reference voltage;

wherein the coupling circuit includes:
- a first secondary transistor, which is connected in series with the mirror transistor; and
- a first operational amplifier, inputs of the first operational amplifier being electrically connected to the drain terminals of the main transistor and of the mirror transistor, and an output of the first operational amplifier being electrically connected to the gate terminal of the first secondary transistor.

9. An integrated circuit for limiting a switchable load current, comprising:
- a main transistor switchable between a conductive state and a non-conductive state, through which in the conductive state a load current flows for supplying a load;
- a mirror transistor, a gate terminal of the mirror transistor being electrically connected to a gate terminal of the main transistor, and a source terminal of the mirror transistor being electrically connected to a source terminal of the main transistor;
- a coupling circuit which is electrically connected to drain terminals of the main transistor and the mirror transistor and is configured to track a source drain voltage of the mirror transistor as a function of the source drain voltage of the main transistor;
- a gate control circuit, which is electrically connected to the gate terminal of the main transistor and which is configured to limit the load current through the main transistor based on a drain current through the mirror transistor; and
- a second current sink, which is electrically connected to a drain terminal of the first secondary transistor, wherein the gate control circuit includes a comparator and is configured to switch the main transistor into a non-conductive state when the drain current through a second mirror transistor is greater than a current value of the second current sink.

10. A method for limiting a switchable load current, the method comprising:
- providing a mirror transistor and a main transistor, the main transistor being switchable between a conductive state and a non-conductive state and through which in the conductive state a load current flows for supplying a load, a gate terminal of the mirror transistor being electrically connected to a gate terminal of the main transistor and a source terminal of the mirror transistor being electrically connected to a source terminal of the main transistor;
- providing a coupling circuit which is electrically connected to drain terminals of the main transistor and the mirror transistor and is configured to track a source drain voltage of the mirror transistor as a function of the source drain voltage of the main transistor;
- providing a gate control circuit, which is electrically connected to the gate terminal of the main transistor and which is configured to limit the load current through the main transistor based on a drain current through the mirror transistor;
- tracking a source drain voltage of the mirror transistor as a function of a source drain voltage of the main transistor; and
- limiting a load current through the main transistor based on a drain current through the mirror transistor;

wherein the coupling circuit includes:
- a first secondary transistor, which is connected in series with the mirror transistor; and
- a second secondary transistor, which is diode-connected and is connected in series with the main transistor, a gate terminal of the first secondary transistor being electrically connected to a gate terminal of the second secondary transistor;
- a first current sink connected to the drain terminal of the second secondary transistor.

11. The method for limiting a switchable load current as recited in claim 10, wherein the limiting includes a regulating or a switching off.

* * * * *